(12) United States Patent
Sankabathula et al.

(10) Patent No.: US 7,656,970 B1
(45) Date of Patent: Feb. 2, 2010

(54) APPARATUS FOR A WIRELESS COMMUNICATIONS SYSTEM USING SIGNAL ENERGY TO CONTROL SAMPLE RESOLUTION AND RATE

(75) Inventors: Dharani Naga Sailaja Sankabathula, Vijayawada (IN); Partha Sarathy Murali, Hyderabad (IN); Sivaram Trikutam Alukuru, Hyderabad (IN)

(73) Assignee: Redpine Signals, Inc., San Jose, CA (US)

( * ) Notice: Subject to any disclaimer, the term of this patent is extended or adjusted under 35 U.S.C. 154(b) by 519 days.

(21) Appl. No.: 11/515,314

(22) Filed: Sep. 1, 2006

(51) Int. Cl.
 *H03K 9/00* (2006.01)
(52) U.S. Cl. ..................................................... 375/316
(58) Field of Classification Search ................... 375/316
 See application file for complete search history.

(56) References Cited

U.S. PATENT DOCUMENTS

| | | | | |
|---|---|---|---|---|
| 4,417,102 A * | 11/1983 | Allen | ........................... | 704/227 |
| 4,755,795 A * | 7/1988 | Page | ........................... | 341/51 |
| 4,785,415 A * | 11/1988 | Karlquist | ..................... | 713/401 |
| 5,870,022 A * | 2/1999 | Kuhnly et al. | ................ | 340/567 |
| 6,061,385 A * | 5/2000 | Ostman | ....................... | 375/130 |
| 6,243,430 B1* | 6/2001 | Mathe | ......................... | 375/346 |
| 6,498,819 B1* | 12/2002 | Martin | ........................ | 375/345 |
| 6,864,817 B1* | 3/2005 | Salvi et al. | .................. | 341/139 |
| 6,993,291 B2 * | 1/2006 | Parssinen et al. | .......... | 455/67.11 |
| 7,254,198 B1* | 8/2007 | Manickam et al. | ........... | 375/348 |
| 2006/0181797 A1* | 8/2006 | Sugawara et al. | ............. | 360/51 |
| 2006/0251186 A1* | 11/2006 | Qian | ........................... | 375/316 |

OTHER PUBLICATIONS

Jincheol Yoo, "A power and resolution adaptive flash analog-to-digital converter", Proceedings of the 2002 International Symposium on Low Power Electronics and Design, 2002, ISLPED '02, 2002 pp. 233-236.*

Anttonen, "Performance and complexity analysis for adaptive sample rate converters in GSM/UMTS/HIPERLAN2 mobile transceiver", 2002 IEEE International Symposium on Circuits and Systems, ISCAS 2002, vol. 4, May 26-29, 2002 pp. IV-489-IV-492 vol. 4.*

Jussila, "Minimization of power dissipation of analog channel-select filter and Nyquist-rate A/D converter in UTRA/FDD", Proceedings of the 2004 International Symposium on Circuits and Systems, 2004, ISCAS '04, vol. 4, May 23-26, 2004 pp. IV-940-3 vol. 4.*

* cited by examiner

*Primary Examiner*—Juan A Torres
(74) *Attorney, Agent, or Firm*—File-EE-Patents.com; Jay A. Chesavage (57) ABSTRACT

A wireless signal processor includes an analog front end for generating at least one baseband analog signal, at least one analog to digital converter for converting the baseband signal into a digital signal, the analog to digital converter having a resolution width and a sampling rate, and a baseband processor for measuring the signal energy in the analog to digital converter output, and when the incoming signal energy level increases or a baseband processor detects a packet, at least one of the sampling rate or resolution width also increases until the end of the packet, after which the sample rate and resolution are reduced to an interpacket rate and resolution. Additionally, the sampling rate and resolution increase after packet detection at rates and resolutions which are dependent on packet type and data rate.

34 Claims, 9 Drawing Sheets

Figure 3B
Sample Rate & Resolution (802.11b mode, low signal case)

Figure 3D
Sample Rate & Resolution (OFDM mode, low signal case)

APPARATUS FOR A WIRELESS COMMUNICATIONS SYSTEM USING SIGNAL ENERGY TO CONTROL SAMPLE RESOLUTION AND RATE

FIELD OF THE INVENTION

The present invention is directed to the field of wireless communication equipment, particularly battery-operated equipment operating in varying SINR (signal plus interference to noise ratio) conditions where a reduction of power consumption is useful for extending the battery life.

BACKGROUND OF THE INVENTION

Figure 1:
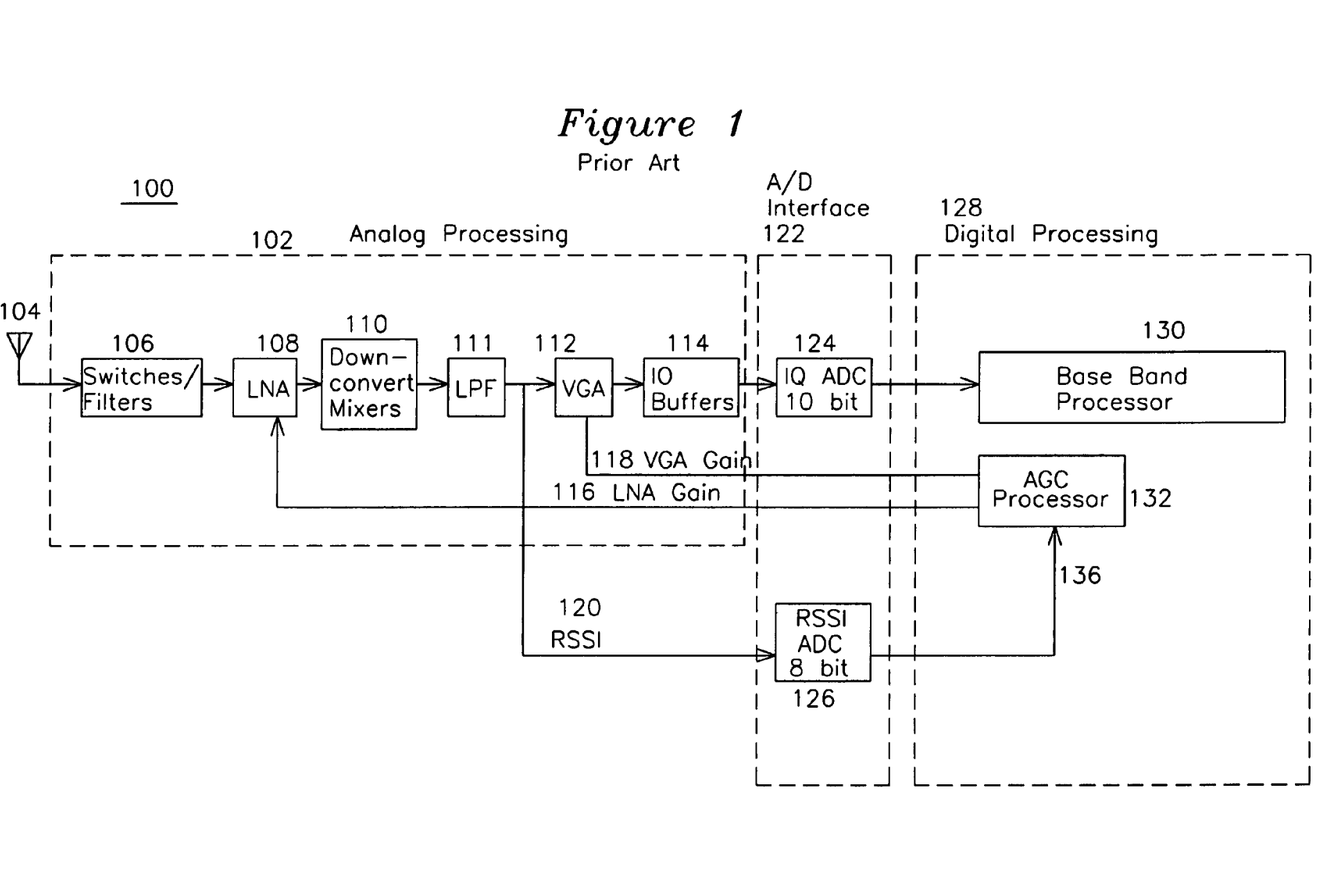
FIG. 1 shows the block diagram for a prior art wireless communications receiver.

FIG. 1 shows a prior art wireless communications receiver 100. An analog part of the receiver 102 comprises an antenna 104 for coupling wireless signals, which pass through transmit/receive switches and filters 106, and to variable gain low noise amplifier 108, which typically accepts a coarse gain control input 116 for reducing the LNA gain for high signal levels and increasing the LNA gain for low signal levels, thereby keeping the mixer 110 operating linearly in a noise performance optimized operating point. Baseband mixers 110 down-convert the modulated signal to a quadrature baseband signal, where a variable gain amplifier 112 optimizes the signal level to the sampling range of the signal leaving the analog signal processing subsection 102 to the in-phase (I) and quadrature (Q) analog to digital converter 124, also known as the IQ ADC. The selection of an optimum VGA 112 gain results in the IQ ADC 124 sampling the signal to fill the linear range of the converter 124, and the signals are passed to the baseband processor 130. A received signal strength indicator (RSSI) signal is typically generated by one of the analog processing stages, which is shown following the low pass filter 111 as output 120. The RSSI signal 120 provides a coarse indication of incoming signal strength, and is typically digitized by RSSI ADC 126 and processed by AGC processor 132 to generate the LNA gain 116 and VGA gain 118. In this manner, the prior art AGC processor samples an RSSI signal and generates gain control signals to optimize the sample range of the ADC and baseband processor 130.

The communications receiver 100 separates into processing sections based on the type of technology in use. Analog processing 102 typically uses small signal amplifying elements such as linear amplifiers 108 and 112, buffers 114, and non-linear elements such as mixer 110. Typically these analog components have high current consumption for optimized high speed performance, and the power consumed by analog section 102 is a significant part of the system power. A/D Interface 122 includes high speed IQ ADC 124 which samples the down-converted and filtered baseband signal for processing and low speed ADC 126 for sampling the RSSI signal 126. The IQ ADC typically operates at a much higher sampling rate (80 MHz typically) and quantization level (10 bit) than the low speed (20 MHz or less at 8 bit) RSSI ADC. The remaining components are digital signal processing elements 128 which have power consumption that is governed by the clock rate of the synchronous clock used to drive the various stages.

For battery powered wireless receivers, it is desired to reduce the power consumption, thereby proportionally increasing the battery life powering the receiver. The opportunities for reduced power consumption for each section of the prior art receiver 100 are somewhat limited. The analog processing 102 consumes a fixed amount of power regardless of whether a packet is being received or not, and in operating conditions where the time spent receiving packets is low compared to the time spent listening for packets to receive, a large power savings may be realized by using the IQ ADC and RSSI ADC only during the intervals when they are required. The ADC interface 122 has a power consumption which includes a fixed part and a part that is proportional to the sample rate and bit width of the ADC, and is dominated by high speed converter 124. The digital processing 128 including baseband processing 130 and AGC processor 132 are dominated by displacement currents associated with switching large numbers of signal conductors from one voltage level to another, resulting in a power consumption which is largely proportional to clock speed.

In wireless systems having an analog front end without an RSSI indicator 120 or RSSI ADC 126, the prior art IQ ADC 124 operates in a full power operational mode. It is desired to provide a reduced power consumption mode for the analog to digital converter such that the power consumption of the IQ ADC 124 is reduced when a packet is not being received by generating an estimate of signal energy based on incoming baseband digitized signals to the baseband processor 130.

OBJECTS OF THE INVENTION

A first object of the invention is a power saving wireless receiver whereby the analog to digital converter sample rate is reduced after the end of a packet and the sample rate is increased when the digitized baseband signal increases in energy level.

A second object of the invention is a power saving wireless receiver whereby the analog to digital converter bitwidth is reduced following the end of a packet and increased when the digitized baseband signal increases in energy level.

A third object of the invention is a power saving wireless receiver whereby the analog to digital converter bitwidth is reduced and the sample rate is reduced following the end of a packet, and the bitwidth is increased and the sample rate is increased when the digitized baseband signal energy level increases.

A fourth object of the invention is a power saving wireless receiver whereby the analog to digital converter sample resolution and rate are dependent on the MODE and RATE of the current packet, such that for a current 802.11b MODE packets, the preamble, header, and payload sample rate and resolution are 8 bit, 20 MHz or 40 MHz, and for a current OFDM MODE packet, the preamble and header sample rate and resolution are 40 MHz and 10 bit, and the payload sample rate and resolution are either 20 MHz or 40 MHz or 80 MHz depending on the RATE field from the header and analog filter specification, and when no packet is being received, the sample rate and resolution are at a comparatively lower interpacket gap sample rate and resolution.

SUMMARY OF THE INVENTION

In a first embodiment, an analog front end receives wireless signals, baseband converts them, and delivers them to an analog to digital converter. The analog to digital converter digitizes the baseband signals at a sampling rate and with a resolution bitwidth and passes the baseband signals to a baseband processor, which analyzes the incoming digital stream to detect an increase in signal energy level. The increase in sampled energy level causes an increase in the sampling rate for the baseband processor to decode a MODE and RATE from the newly arrived preamble and header, which may be further used for OFDM or 802.11b packets to vary the sample rate and resolution. During the interval of time the baseband processor is waiting for an increase in signal energy level, the sample rate of the converter is reduced to an interpacket rate sufficient to determine the signal energy level has increased, and the sample rate is increased to an operational rate sufficient to demodulate the incoming packet after the signal energy level has increased.

In a second embodiment, an analog front end receives wireless signals, baseband converts them, and delivers them to an analog to digital converter. The analog to digital converter digitizes the signals at a sampling rate and with a resolution bitwidth and passes the baseband signals to a baseband processor, which analyzes the incoming digital stream to detect an increase in signal energy level, and subsequently to detect a packet including a preamble and header. During the interval of time the baseband processor is waiting for an increase in signal energy level, the resolution bitwidth of the converter is reduced to an interpacket sampling resolution sufficient to determine that the signal energy level has increased, and the sampling resolution bitwidth is reduced to an operational bitwidth sufficient to determine that the signal energy level has increased. After a rise in energy level or detection of a packet by the baseband processor, the resolution bitwidth is increased and the MODE and RATE are decoded, which may be further used for OFDM or 802.11b packets to vary the sample rate and resolution until the end of the current packet.

In a third embodiment, an analog front end receives wireless signals, baseband converts them, and delivers them to an analog to digital converter. The analog to digital converter digitizes the signals at a sampling rate and with a resolution bitwidth and passes the baseband signals to a baseband processor, which analyzes the incoming digital stream to detect an increase in signal energy level, and subsequently to detect a packet including a preamble and header. During the interval of time the baseband processor is waiting for an increase in signal energy level, the sampling rate and resolution bitwidth of the converter is reduced to an interpacket sampling rate and sampling resolution sufficient to determine the signal energy level has increased, and the sampling rate and resolution bitwidth are increased to a preamble, header, and payload sampling rate and resolution bitwidth sufficient to demodulate the incoming packet after the signal energy level has increased. After a rise in energy level or detection of a packet by the baseband processor, the resolution bitwidth and sampling rate are increased and the MODE and RATE are decoded, which may be further used for OFDM or 802.11b packets to vary the sample rate and resolution until the end of the current packet.

DETAILED DESCRIPTION OF THE INVENTION

Figure 2:
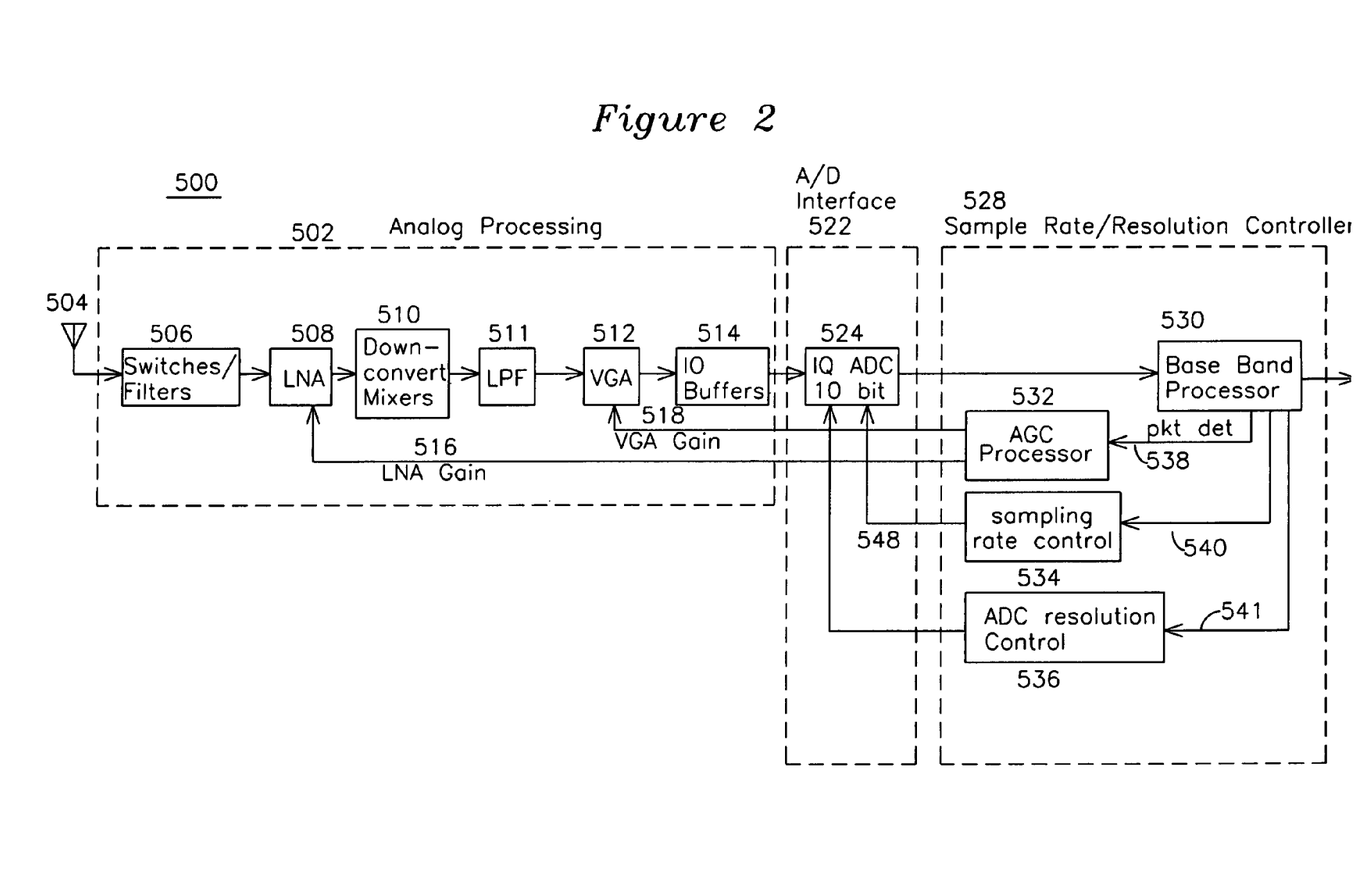
FIG. 2 shows the block diagram for a variable sample rate and sample resolution wireless communications system.

FIG. 2 shows an embodiment 500 of the present invention having an analog processor 502, an A/D interface 522, and a sample rate/resolution controller 528, whereby an RSSI signal is not generated by the analog processor 502 or no such signal is available, or if one is available, it is not used. Wireless signals enter the antenna 504, pass through the transmit switches and receive filters 506, the low noise amplifier 508, baseband mixers 510, variable gain amplifier 512, and IO buffers 514, as before. Following the end of packet, the adjustable gain amplifiers 508 and 512 are typically set to an increased gain setting, although the gain may be reduced if the previous packet was a very low signal level, and this amplifier output is presented to the ADC 524, which generates the I and Q baseband digitized output that is sampled by the baseband processor 530, as before. The baseband processor 530 generates a packet detect signal 538 when a packet signal is detected, during which time the AGC processor 532 increases or decreases the gain of the analog processing gain elements 508 and 512 with respective gain control signals 516 and 518, as in the prior art. The power savings of FIG. 2 are realized through two mechanisms which are available either independently or in combination. During an interval when no packet energy increase is currently detected, the ADC rate controller 534 generates a sampling clock 548 which is at an interpacket sample rate sufficient to enable the ADC 524 to sample the incoming baseband signal to determine whether a signal is present or not. A sampling rate less than 30 MHz may be used for the interpacket sampling rate, and a sampling rate greater than 30 MHz may be used for the operational (preamble and/or header) rate, although any frequency other than 30 MHz could also be used as the separation rate. In the best mode of the invention, this sampling rate can be ¼ of the nominal rate required for baseband processor operation, and for the 802.11 family of wireless signals, the IQ ADC typically operates at an operational sampling rate of 80 MHz for each of the I and Q converters of the ADC 524, and this operational rate may be reduced to 20 MHz until the time packet energy is being detected. Once packet energy is detected, as evidenced by a change in the amplitude of the sampled signals as detected by the baseband processor 530, the baseband processor asserts rate control signal 540, which causes the ADC rate controller 534 to switch to the higher frequency sampling rate such as 80 MHz or 40 MHz. If a packet is detected by the baseband processor, as by packet detection of the prior art, the baseband packet detect generates the packet detect signal 538 when the preamble of the packet is received. The power consumption of the IQ ADC varies proportionally with its sampling rate, so as an example, for a pair of A/D converters sampling a quadrature baseband analog signal leaving 514, the operational rate of 80 MHz would draw 100 mA of current, and when the ADC rate controller 534 drops this rate to 20 MHz, the current draw for the pair of converters would drop to approximately 25 mA. Additionally, the complexity of the ADC increases with the number of conversion bits, and since the number of bits of conversion required for the baseband processor to detect an increase in incoming baseband energy is generally less than the number of bits required to accurately decode the incoming symbol, the resolution of the ADC represents an additional degree of freedom which can be changed from an interpacket gap interval to the preamble interval.

Figure 3A:
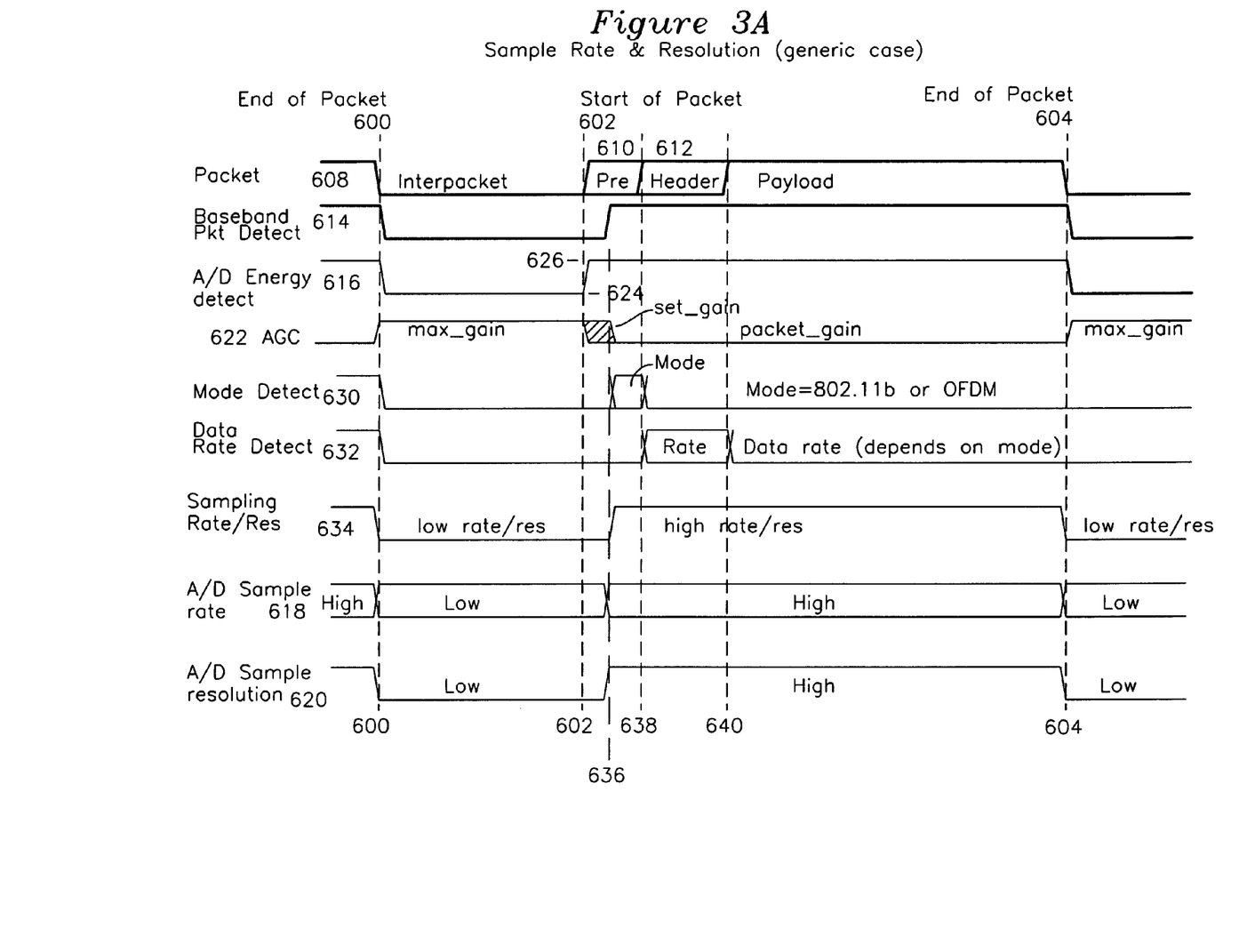
FIG. 3A shows the waveforms for the communications system of FIG. 2.

FIG. 3A shows the generic operation of the ADC sampling rate controller 534. During the interval from end of packet 600 to start of packet 602, the energy detected 616 in the outputs of the IQ ADC 524 by the baseband processor is at a baseline level 624, which is less than the payload energy detect level 626. When the energy detected 616 in the IQ ADC outputs increases as shown in waveform 626, the baseband processor asserts rate/resolution waveform 634 corresponding to rate signal 540 and resolution signal 541 which are in an interpacket gap state from interval 600 to 602 when the A/D energy detect 616 is at the baseline 624, and in a preamble detection state when the A/D energy detect increases as shown in level 626. In this manner, the IQ ADC may have an operational mode with an operational sampling rate and an interpacket gap mode with an IQ ADC sampling rate which is reduced from the operational sampling rate, and the rate controller 534 can change the sampling rate of the converter from one rate to the other in response to the sample rate control signal 540 generated by the baseband processor 530 in response to the IQ ADC energy level increase from a baseline level 624 to an increased level 626.

In a quantizing resolution power saving embodiment of the present invention, the IQ ADC 524 has a 10 bit operational resolution mode and an 8 bit interpacket gap resolution mode. The advantage of having these two modes is that the internal architecture of an ADC causes the number of switching circuits inside the ADC to double with each added bit of resolution. Theoretically, if the power consumption of a dual 10 bit ADC at an operational rate of 80 MHz were 100 mA, this would reduce to ¼th of this consumption if the dual ADC were to switch to an 8 bit mode at the same sampling rate, corresponding to operating with roughly ¼ of the circuitry of the 10 bit mode until a packet energy increase was detected and the converter switched to 10 bit mode. In actual practice, the power savings of changing from 10 bit to 8 bit is closer to 50% due to various other factors, resulting in a current consumption of 50 ma of the earlier example. The ADC resolution control 536 is performed using the resolution control signal 541. Upon assertion of resolution signal 541, the ADC resolution control to the IQ ADC 524 is reduced to 8 bit operation, or any other resolution which results in reduced power consumption while preserving the packet energy detection function of the baseband processor. Furthermore, it is possible to combine the power savings of the standby resolution mode change with the power savings of the standby sampling rate, so if the A/D converter were to change both the sampling rate and the resolution rate, each of which resulted separately in ½ the current draw, the result of using both in combination would be the consumption of ⅛ the operation mode power consumption.

Figure 4A:
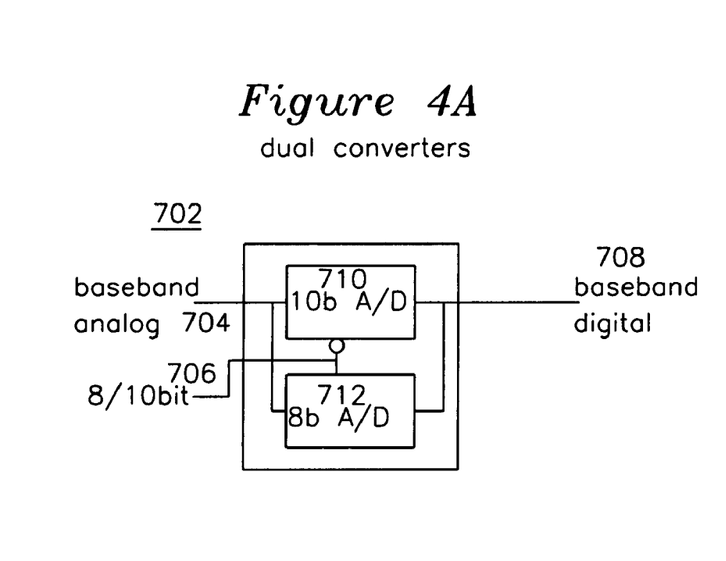
FIG. 4A shows the block diagram for an variable resolution a/d converter.
Figure 4B:
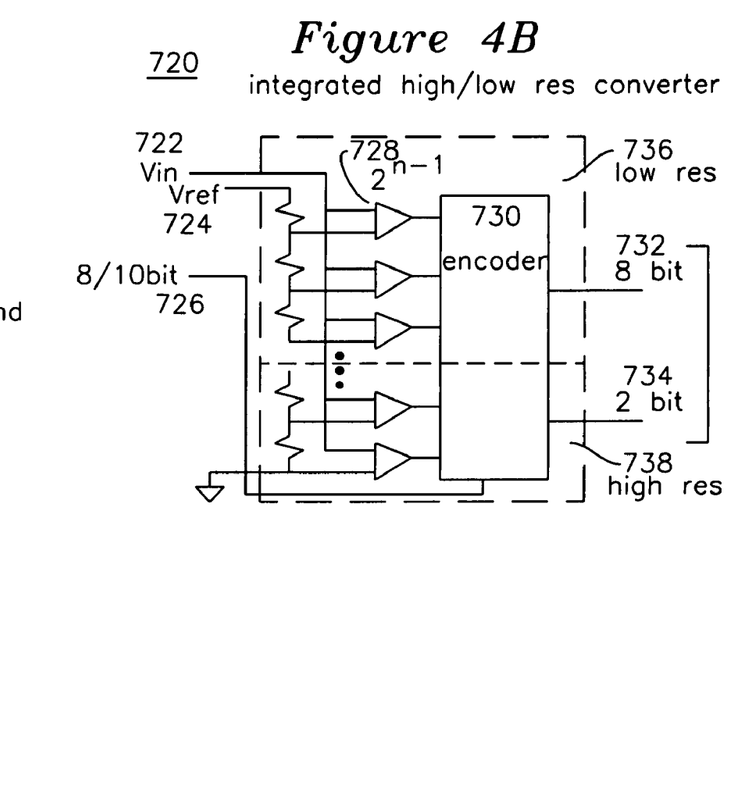
FIG. 4B shows the block diagram for a variable resolution flash a/d converter.

FIG. 4A shows a dual resolution bit width A/D converter 702 which comprises a lower resolution converter 712 in parallel with a high resolution converter 710 including an enable signal 706 which selects one converter or the other, each converter coupled to a baseband analog input 704 and generating a digitized output 708. An example of a prior art fixed resolution bit width flash A/D converter would be MAX1181 manufactured by MAXIM® Integrated Products company in Sunnyvale, Calif. As described in the application note AN634 by MAXIM®, flash converters require 2n-1 comparators which generate 2n-1 inputs to an encoder. FIG. 4B shows a modified integrated single flash converter, whereby an input 722 is compared by 2n-1 comparators and encoder 730 to generate a reduced resolution output 732, which is always enabled. For an 8 bit converter, the number of comparators in the low resolution section 736 would be 255 comparators, whereas for a 10 bit converter, the number of comparators would be 1023 comparators. It would be possible to put the 255 comparators of the low resolution section in 736 and leave those continuously enabled, and to place the other 1023–255=768 comparators in the high resolution section 738, and separate the encoder 730 as shown. In this manner, the smaller number of comparators and encoder logic required for low resolution bit width 732 would be operational in a low resolution mode, while the high resolution additional bits 734 and much larger circuitry in the high resolution section 738 could be enabled for operational rate mode, as described earlier. In this manner, a variable resolution A/D converter 720 having reduced power consumption during a lower resolution mode may be realized.

Other wireless-mode and data rate specific power saving optimizations are also available. While FIG. 3A illustrates the generic power saving modes available by changing sample rate and sample resolution when changing between a standby mode and an operational mode, it is possible to make incremental power saving sampling rate and resolution bit width changes based on the nature of the packet being received, where each packet of waveform 608 has an interpacket gap from 600 to start of packet 602, a preamble 610 during an interval from 602 to 638, followed by a header 612 during an interval from 638 to 640, followed by a payload during an interval from 640 to end of packet 604. For example, in another implementation of the invention, a baseband energy detection may be performed using an interpacket sampling rate of 20 MHz and an interpacket sampling resolution of 8 bits. In this scenario, packet detection may first occur from the IQ ADC energy detection for high signal packets, or it may occur from the baseband signal processor after the successful correlation of a preamble with a delayed copy of the preamble, as known in the prior art. After packet detection occurs from either of these two mechanisms, the IQ ADC switches to a preamble sample rate of 40 MHz and a preamble sample resolution of 10 bits. Once the preamble is received, the packet may be either high signal or low signal level, and it may be either an 802.11b mode or it may be an OFDM mode such as 802.11g or 802.11a, each case described following.

Figure 3B:
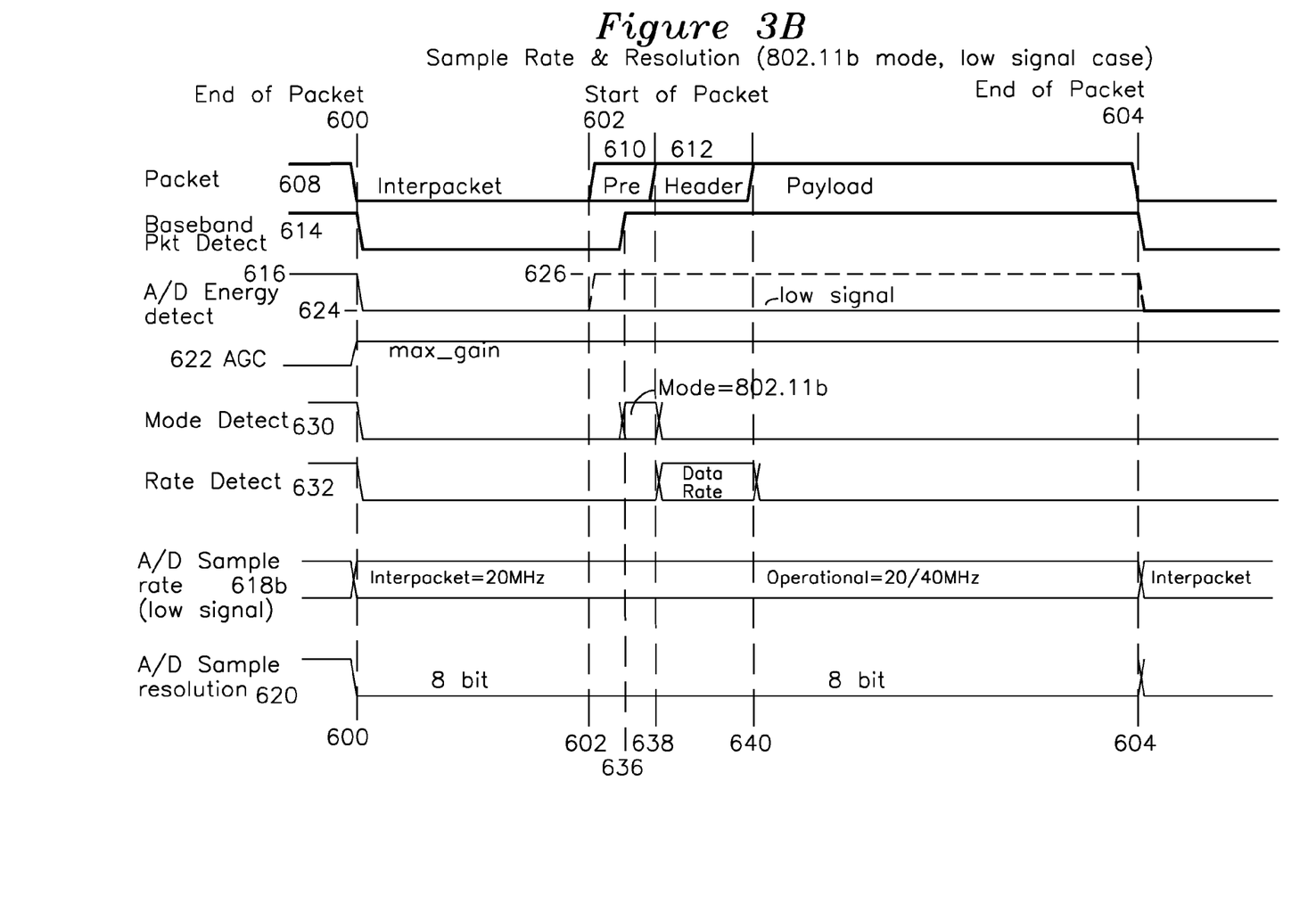
FIGS. 3B & 3C show the waveforms of operation when the wireless signal is an 802.11b wireless packet.
Figure 3C:
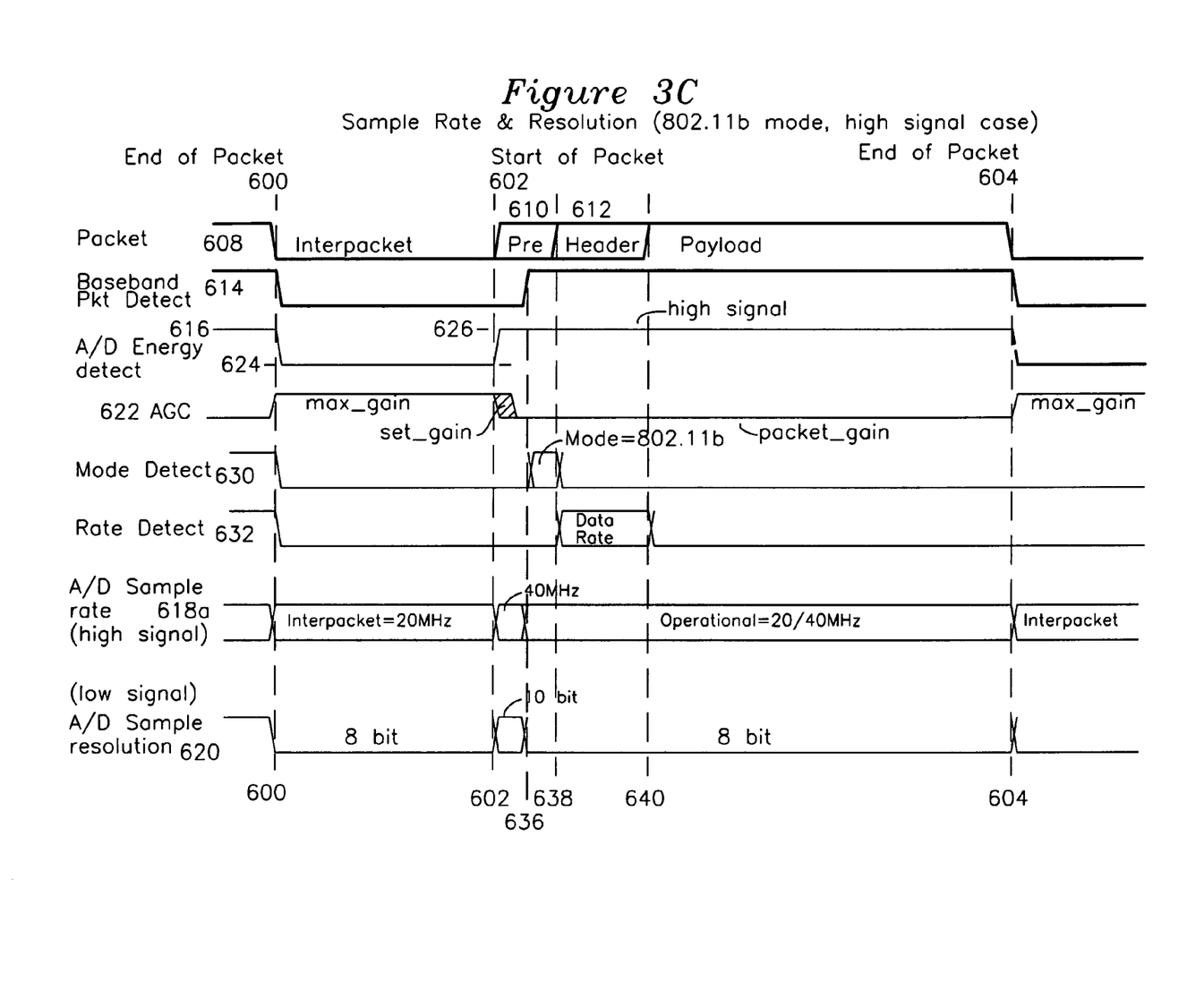

For the case of an 802.11b high signal level packet shown in FIG. 3C, the high signal level packet is first detected by the IQ ADC energy detect 616 at time 602, where the IQ ADC energy detect waveform is asserted 626 for the duration of the packet. As soon as the A/D energy detect is asserted 626, the sample rate changes to the preamble sample rate of 40 MHz as shown in waveform 618*a*, and the analog processing AGC 622 is changed from max_gain to a packet_gain sufficient to receive the packet without saturation, as known in the prior art. The packet mode (MODE) is determined as 802.11b during the time the preamble is received shown in waveform 630, and for an 802.11b packet after the 802.11b mode is detected, the header sampling rate of 20 MHz or 40 MHz 618 and header sampling resolution of 8 bits 620 may be used after detection of 802.11b mode from the preamble. A payload sampling rate of 20 MHz or 40 MHz and payload sampling resolution 620 of 8 bits is sufficient for 802.11b packets. For the case of a low signal 802.11a packet shown in FIG. 3B, the processing is similar, but the A/D energy detect 616 may not detect the packet and remain unasserted, as shown in waveform 616, low signal. The AGC 622 remains in max_gain, and the baseband packet detect 614 detects the packet, for example using the prior art technique of correlation of an incoming signal with a delayed copy of the incoming signal. In the low signal case, the later packet detection results in the sample rate 618*b* remaining at the payload sample rate of 20 MHz, optionally changing to a payload sampling rate of 40 MHz, but does not change to the preamble sample rate at a later time 636 during the preamble 610, as shown, as the mode has already been determined to be 802.11b, the header and payload rate and resolution change to 20 MHz or 40 MHz and 8 bit, respectively. The other sampling rates and resolutions are similar to the high signal case. The operational (or payload) sampling rate such as 20 MHz or 40 MHz (at high or low signal strength) depends on the quality of the RF mixer baseband filter, such as 511 of FIG. 2, which rejects adjacent channel out-of-band interference, as described in the IEEE standards 802.11a-1999 paragraph 17.3.10.2. A high order baseband filter prior to the A/D converter has the effect of reducing the sampling rate requirement.

Figure 3D:
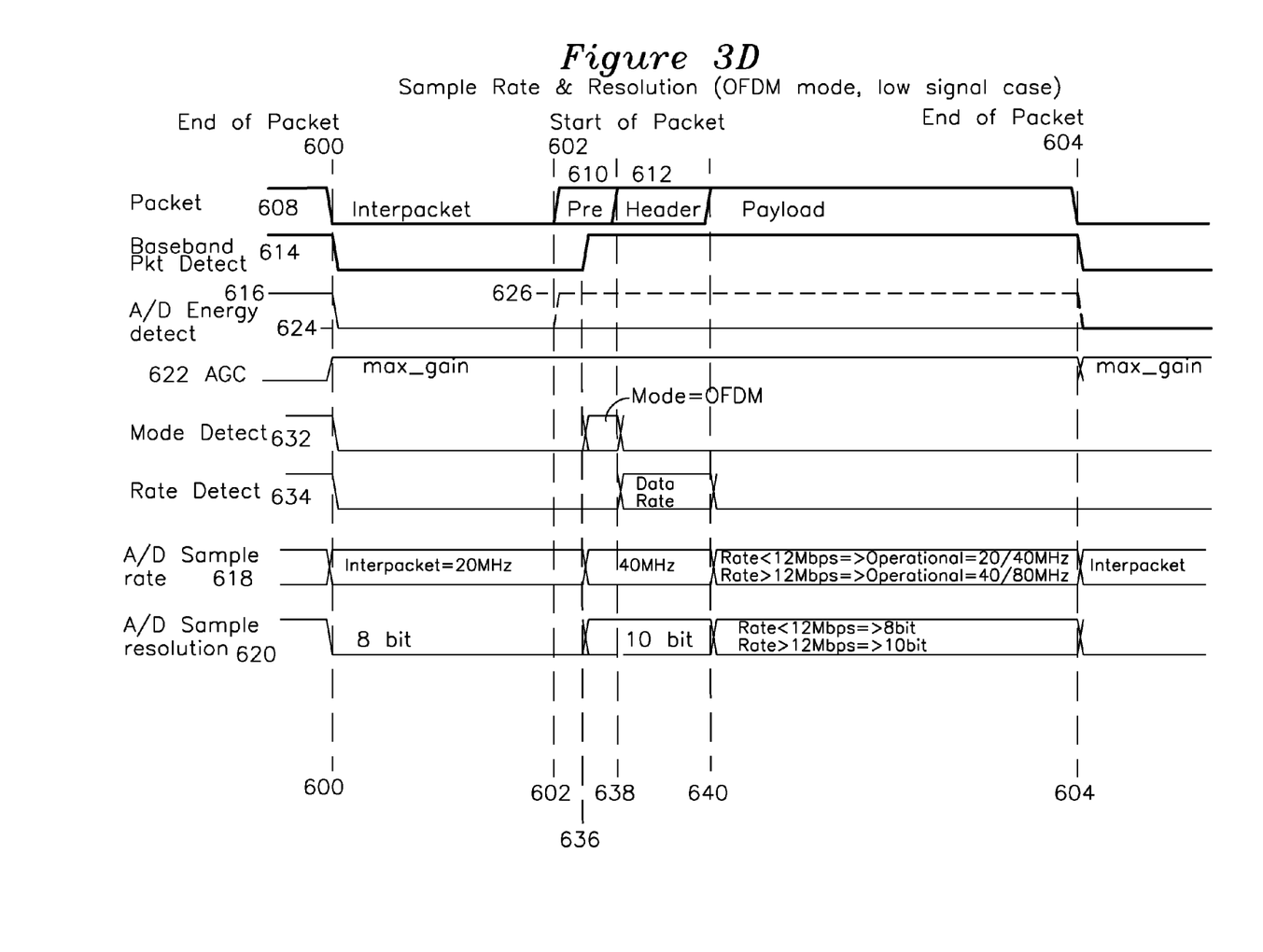
FIG. 3D shows the waveforms of operation when the wireless signal is a low level OFDM signal.
Figure 3E:
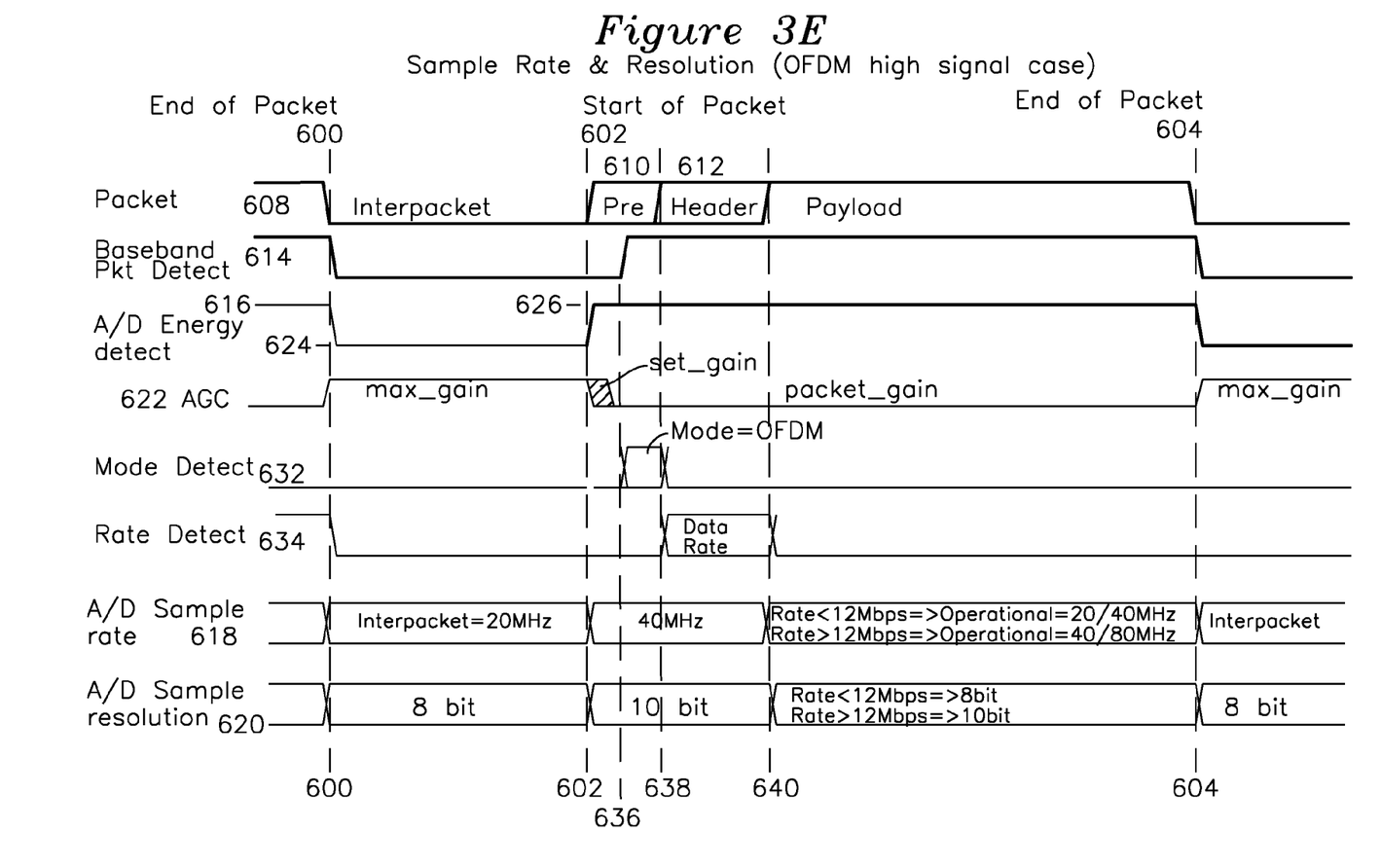
FIG. 3E shows the waveforms of operation when the wireless signal is a high level OFDM signal.

FIGS. 3D and 3E show the OFDM reception cases for low and high signal cases, respectively, where the processing sequence is the same leading to the rate detection, after which a different set of decisions related to A/D sample rate and A/D resolution can be made to further reduce power consumption. FIG. 3D shows the low signal OFDM packet case, where the A/D sample rate during the interpacket interval 600 to 602 is 20 MHz, and the signal level is too low to be detected by the IQ ADC energy detect sampling at an interpacket sample rate of 20 MHz with an interpacket sample resolution of 8 bits, as described earlier. The A/D energy detection 616 remains at level 624, the AGC 622 remains in max_gain, and baseband packet detect 614 is asserted in the middle of the preamble, causing the A/D sample rate to change to the preamble sample rate of 40 MHz and preamble sample resolution of 10 bits, and OFDM mode 632 is detected. During the header interval 612, the data rate of the payload is extracted from the header contents, and the OFDM data rate determines the A/D payload sampling resolution during the payload interval from 640 to 604. For data rates greater than 12 Mbps as determined by the header, the payload sample rate and resolution is 80 MHz or 40 MHz and 10 bit, while for data rates less than 12 Mbps, the payload sample rate and resolution is 20 MHz or 40 MHz and 8 bits, as shown in waveform 620. While the data rate threshold for OFDM payload sample rate and resolution is shown to be 12 Mbps, this data rate threshold could be a higher or lower value, including 18 Mbps or 24 Mbps. As was described earlier for 802.11b, the operational sampling rate may depend on the quality of the analog filter 511 in the RF processing. An OFDM payload sampling rate of 40 MHz or 80 MHz may depend on the out of band interference reduction of filter 511 of FIG. 2, as described in 802.11b-1999 paragraph 18.4.8.3.

The high signal OFDM case is shown in FIG. 3E, where the A/D energy detect 616 is asserted 626 upon detection of a packet energy rise, which causes the A/D sample rate to change from the interpacket sampling rate of 20 MHz and interpacket sampling resolution of 8 bits to the preamble sampling rate of 40 MHz and preamble sample resolution of 10 bits, as before. The OFDM mode is detected in 632, and the A/D sample rate continues with the header sampling rate of 80 MHz and header sampling resolution of 10 bits during the header interval 612 where the payload data rate is extracted. After the data rate is determined, the ADC payload sample rate may be changed to 20 MHz or 40 MHz for payload data rates less than 12 Mbps, and to 40 MHz or 80 MHz for payload data rates greater than 12 Mbps, while the ADC payload sample resolution of 8 bits may be used for data rates less than 12 Mbps, and an ADC payload sample resolution of 10 bits may be used for data rates greater than 12 Mbps.

Figure 5:
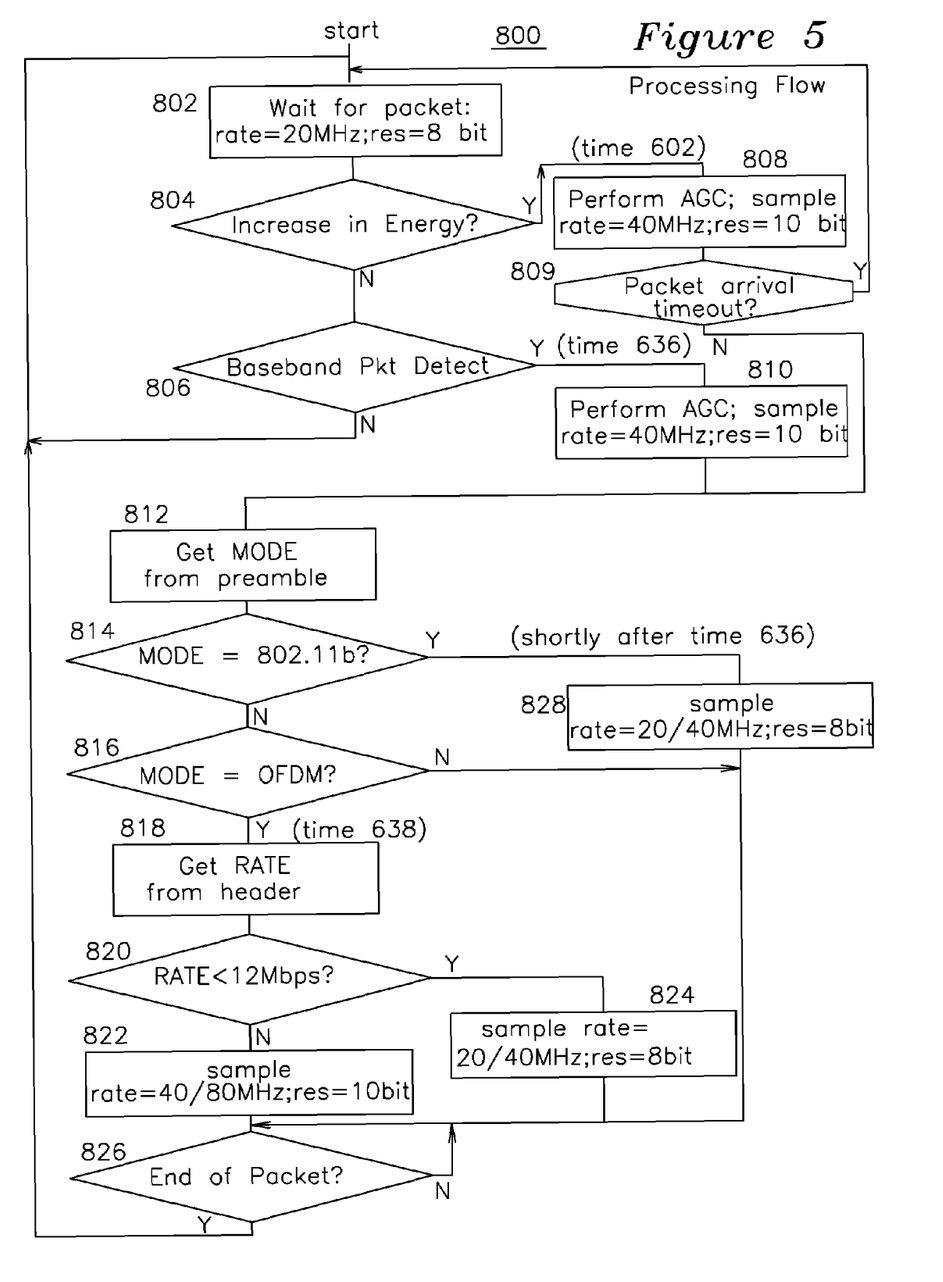
FIG. 5 shows the processing sequence for a signal processor having a variable rate and variable resolution A/D converter.

FIG. 5 shows the process flow 800 for the present invention. The process starts at step 802, which is the function waiting for a packet, with an interpacket sampling rate of 20 MHz and an interpacket sampling resolution of 8 bits. Upon early packet detection 804 based on an increase in energy at the IQ ADC, or later packet detection 806 from the baseband processor the AGC function is performed. In step 812, the MODE is determined as either 802.11b 814 or OFDM 816. Immediately upon determination that mode MODE is 802.11b, the header sample rate and resolution, and subsequent payload sample rate and resolution, are set to 20 MHz or 40 MHz and 8 bit, respectively in step 828. If the MODE is determined to be OFDM 816, the sample rate and resolution continue to be 40 MHz and 10 bit, respectively, as previously set in step 810, and the data RATE field is read from the header in step 818, while continuing the header sample rate and resolution of 40 MHz and 10 bit, respectively. If the data RATE is greater than 12 Mbps, the payload sample rate and resolution are 40 MHz or 80 MHz and 10 bit as shown in step 824. If the data RATE is<=12 Mbps, the payload sample rate and resolution are 20 MHz or 40 MHz and 8 bit, respectively. The sampling rates and resolutions remain unchanged until the end of packet 826, when they revert to the interpacket rate and resolution of 20 MHz and 8 bit. In this manner, the receiver is able to operate at only the sampling rate required for the particular baseband information being processed.

This examples given for FIGS. 3B through 3E are for illustrative purposes only for complete understanding of the invention. It is clear that different A/D sampling rates and A/D sample resolutions from those shown in the examples may be used in response to various wireless packet modes and data rates and continue to practice the invention as described herein. It is further understood that the specific sampling rates may be varied higher or lower by a factor of two or more from the nominal values given, and the underlying power savings results from the relative frequency and resolution bitwidth for the interpacket, preamble, header, and payload intervals. The invention may also be practiced with a range of sampling rates, such that the interpacket sampling rate of 20 MHz may be any range such as 10 MHz to 30 MHz, the preamble and header sampling rates of 40 MHz may be any range such as 20 MHz to 80 MHz, and the earlier described payload sampling rates of 20 MHz, 40 MHz, and 80 MHz for various packet modes and rates may be in any range, including the ranges of 10 MHz-30 MHz, 20 MHz-60 MHz, and 60-120 MHz, respectively.

Additionally, the signal energy rise which causes the sampling rate or resolution to change can be as little as 2-3 dB, or a larger value. Since a rise in signal level may be due to an interfering source rather than an incoming packet, it may be also useful to add a time-out interval, such that if a rise in energy level is detected, but a packet detect signal is not generated by the baseband processor such as by correlation of the incoming symbol with a delayed copy of this signal, or any other signal analysis which generates a packet detect from information in the preamble, the signal processor may revert back to interpacket gap sampling rate and resolution until the next rise in energy is detected.

We claim:

1. A signal processor for a wireless receiver, the signal processor having:
   an analog front end for receiving wireless signals and producing a baseband output, said wireless signals including packets having at least a preamble, header, and payload, and an interpacket gap at other times;
   one or more analog to digital converters (ADC), each having an analog input and a digitized output having a resolution bit width, said analog input coupled to said baseband output to sample an energy level, each said analog to digital converter having an interpacket gap sampling rate until said sampled energy level has increased; and a baseband processor coupled to at least one said analog to digital converter digital output, said baseband processor asserting a start of packet energy signal when said sampled energy level increases, thereafter increasing the sample rate of said ADC to a rate greater than said interpacket gap sample rate until said packet has been received, after which said ADC sample rate changes back to said interpacket sample rate.

2. The signal processor of claim 1 where said baseband processor includes a packet preamble detection which increases said ADC sample rate to a rate greater than said interpacket gap sample rate when said baseband processor detects said packet preamble.

3. The signal processor of claim 1 where said interpacket gap sampling rate is less than 30 MHz, and said increased sampling rate is greater than 30 MHz.

4. The signal processor of claim 1 where the sample rate of said preamble is in the range of 20 MHz to 80 MHz.

5. The signal processor of claim 1 where the sample rate of said header is in the range of 20 MHz to 80 MHz.

6. The signal processor of claim 1 where the packet type of said preamble determines the payload sample rate.

7. The signal processor of claim 1 where when the packet type of said preamble is 802.11b, said header and said payload are sampled in the range of 10 MHz to 60 MHz.

8. The signal processor of claim 1 where when the packet type of said preamble is OFDM, and said header indicates a data rate greater than a data rate threshold, the sample rate of said payload is in the range of 40-120 MHz, and when said header indicates a data rate less than or equal to said data rate threshold, the sample rate of said payload is in the range of 20 MHz to 60 MHz.

9. The signal processor of claim 1 where said sample rate is in the range 10 MHz to 30 MHz when said baseband processor detects the end of said payload.

10. The signal processor of claim 1 where the sample rate of said interpacket gap is 20 MHz and the sample rate of said header is 40 MHz.

11. The signal processor of claim 1 where when the type of said preamble is determined to be 802.11b, said sample rate changes to 20 MHz or 40 MHz.

12. The signal processor of claim 1 where when the type of said preamble is determined to be OFDM and the data rate of said header is greater than 12 Mbps, said sample rate is 40 MHz or 80 MHz.

13. The signal processor of claim 1 where when the type of said preamble is determined to be OFDM and the data rate of said header is less than 12 Mbps, said sample rate is 20 MHz or 40 MHz.

14. The signal processor of claim 1 where said sample rate is 20 MHz when said baseband processor detects the end of said payload.

15. The signal processor of claim 1 where said analog to digital converter consumes more power when said sampling rate is higher than when said sampling rate is lower.

16. The signal processor of claim 1 where said baseband processor generates a packet detect signal from the correlation of said digitized output with a delayed copy of said digitized output.

17. The signal processor of claim 16 where said increased sampling rate occurs at the earlier of said baseband processor packet detect or said sampled energy level increase.

18. A signal processor for a wireless receiver, the signal processor having:
an analog front end for receiving wireless signals and producing a baseband output, said wireless signals including packets having at least a preamble, header, and payload, and an interpacket gap at other times;
one or more analog to digital converters, each having an analog input and a digitized output having a resolution bit width, said analog input coupled to said baseband output and sampling an energy level, each said analog to digital converter having a sampling rate input; and
a baseband processor coupled to at least one said analog to digital converter digital output, said baseband processor establishing a baseband signal level from said digital output, comparing said digital output to said baseband signal level and changing said resolution bit width when said digital output energy level increases.

19. The signal processor of claim 18 where said analog to digital converter is a flash converter.

20. The signal processor of claim 18 where said resolution bit width is decreased after the end of said payload or when said baseband processor has not detected a packet.

21. The signal processor of claim 18 where said analog to digital converter resolution is 10 bits or more when said preamble type is OFDM and said header indicates a data rate greater than a data rate threshold.

22. The signal processor of claim 18 where said analog front end generates two analog signals, and the number of said analog to digital converters is two.

23. The signal processor of claim 18 where said analog front end has a programmable gain and said baseband processor sets said programmable gain to a higher value during said preamble.

24. The signal processor of claim 18 where at least one said analog to digital converter has a high resolution mode during at least one of said preamble interval, said header interval, or said payload interval, and a low resolution mode during at least part of said interpacket gap.

25. The signal processor of claim 18 where at least one said analog to digital converter has an 8 bit resolution mode during said interpacket gap and more than 8 bits during at least one of said preamble interval, said header interval, or said payload interval.

26. The signal processor of claim 18 where when the packet type of said preamble is OFDM and said baseband processor signal level is above a threshold, the sampling resolution of said preamble and the sampling resolution of said header are less than when the signal level of said baseband processor is below said threshold.

27. The signal processor of claim 18 where when the packet type of said preamble is OFDM and the signal level of said baseband processor is above a threshold, the sampling resolution of said preamble and sampling resolution of said header are 8 bits.

28. The signal processor of claim 18 where when the packet type of said preamble is OFDM and the data rate from said header is greater than a data rate threshold, the sampling resolution of said payload is 10 bits.

29. The signal processor of claim 18 where when the packet type of said preamble is OFDM and the data rate from said header is less than a data rate threshold, the sampling resolution of said payload is 8 bits.

30. The signal processor of claim 18 where when the packet type of said preamble is OFDM and the data rate from said header is greater than 12 Mbps, the sampling resolution of said payload is greater than when said data rate is less than 12 Mbps.

31. The signal processor of claim 18 where the resolution of said analog to digital converter is 8 bits or less during said interpacket gap interval and greater than 8 bits at other times.

32. The signal processor of claim 18 where the resolution of said analog to digital converter is 8 bits or less during said interpacket gap interval and 10 bits when said energy rise is detected or said baseband processor indicates a valid packet.

33. A signal processor for a wireless receiver, the signal processor having:

an analog front end for receiving wireless signals and producing a baseband output;

one or more analog to digital converters, each having an analog input and a digitized output having a resolution bit width, said analog input coupled to said baseband output and sampling an energy level, each said analog to digital converter having a sampling rate input; and a baseband processor coupled to at least one said analog to digital converter digital output, said baseband processor establishing a baseband signal level from said digital output, comparing said digital output to said baseband signal level and increasing said sampling rate and said bit width resolution when said digital output energy level increases.

34. The signal processor of claim 33 where said analog to digital converter has 10 bits of resolution and said sampling rate is greater than 30 MHz when said energy level increases and less than 10 bits of resolution and less then 30 MHz sampling rate at other times.

\* \* \* \* \*